United States Patent
Drobnik

(10) Patent No.: US 9,275,966 B2
(45) Date of Patent: Mar. 1, 2016

(54) SEMICONDUCTOR DEVICE APPARATUS AND ASSEMBLY WITH OPPOSITE DIE ORIENTATIONS

(75) Inventor: Josef C. Drobnik, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 779 days.

(21) Appl. No.: 13/529,595

(22) Filed: Jun. 21, 2012

(65) Prior Publication Data

US 2013/0341776 A1  Dec. 26, 2013

(51) Int. Cl.
H01L 23/538 (2006.01)
H01L 23/00 (2006.01)
H01L 23/64 (2006.01)
H01L 25/07 (2006.01)
H01L 23/50 (2006.01)

(52) U.S. Cl.
CPC ............ *H01L 24/14* (2013.01); *H01L 23/5385* (2013.01); *H01L 23/642* (2013.01); *H01L 24/17* (2013.01); *H01L 24/40* (2013.01); *H01L 25/072* (2013.01); *H01L 23/50* (2013.01); *H01L 23/5387* (2013.01); *H01L 24/16* (2013.01); *H01L 24/48* (2013.01); *H01L 2224/1329* (2013.01); *H01L 2224/13101* (2013.01); *H01L 2224/14181* (2013.01); *H01L 2224/16225* (2013.01); *H01L 2224/16245* (2013.01); *H01L 2224/40137* (2013.01); *H01L 2224/48227* (2013.01); *H01L 2924/1305* (2013.01); *H01L 2924/1306* (2013.01); *H01L 2924/13055* (2013.01); *H01L 2924/19105* (2013.01)

(58) Field of Classification Search
CPC . H01L 23/538; H01L 23/5385; H01L 23/642; H01L 24/14; H01L 24/17; H01L 21/4871; H01L 21/77
See application file for complete search history.

(56) References Cited

U.S. PATENT DOCUMENTS

| 4,237,522 A * | 12/1980 | Thompson | H01L 23/642 174/253 |
|---|---|---|---|
| 6,888,716 B2 | 5/2005 | List et al. | |
| 6,906,404 B2 * | 6/2005 | Maly | H01L 24/49 257/678 |
| 2009/0016088 A1 * | 1/2009 | Bayerer et al. | 363/125 |
| 2010/0065950 A1 | 3/2010 | Lowry et al. | |

* cited by examiner

*Primary Examiner* — Jose R Diaz
(74) *Attorney, Agent, or Firm* — Lempia Summerfield Katz LLC

(57) ABSTRACT

An electronic apparatus includes a base substrate, the base substrate including an interconnect. The electronic apparatus further includes a first die including a first semiconductor device, the first semiconductor device being coupled to the interconnect, and further includes a second die including a second semiconductor device, the second semiconductor device being coupled to the interconnect. The first and second die are attached to the base substrate in opposite orientations.

20 Claims, 4 Drawing Sheets

SEMICONDUCTOR DEVICE APPARATUS AND ASSEMBLY WITH OPPOSITE DIE ORIENTATIONS

FIELD OF INVENTION

The present embodiments relate to semiconductor devices.

BACKGROUND

Power semiconductor devices are designed to be tolerant of the high currents and voltages that are present in power applications such as power train, motion control, air bag deployment, automotive fuel injector drivers, DC/DC, DC/AC, and AC/DC converters, and other power electronics instruments. Power semiconductor devices, such as insulated gate bipolar junction transistor (IGBT) and field effect transistor (FET) devices, are often used as electronic switches in such applications. IGBT and other power devices are often arranged and packaged in a power electronics module. Multiple modules may be used in circuits to provide phased or alternating current power to inductive loads such as motors or to increase power density.

Multiple aspects of the circuits are designed in an effort to accommodate the currents and noise resulting from inductive loads and/or parasitic inductances during the switching provided by the power semiconductor devices. For example, decoupling capacitors may be incorporated into the circuits to mitigate the effects of noise introduced by parasitic inductances. The decoupling capacitors may decouple portions of the circuit to protect devices from voltage spikes resulting from the parasitic inductances.

Electrical interconnects within power electronics modules present parasitic inductances. For example, wire bonds often introduce inductive noise during switching. In many modules, wire bonds are relied upon to connect terminals of a power semiconductor device to a lead frame. Some wire bonds accordingly handle high currents in many applications. Other wire bonds may also present inductive noise, including those wire bonds used to connect off-chip decoupling capacitors.

These parasitic inductances of such wire bonds may lead to a voltage spike or over-voltage in power electronics modules. Over-voltages may occur in connection with the sudden interruption of current flow to an inductive load despite the decoupling capacitors and other efforts to prevent such over-voltages. These and other over-voltages may destroy the power semiconductor device.

Snubbers are often used to protect the power semiconductor devices. Snubbers attempt to conduct undesirable transient currents around the power semiconductor device. Unfortunately, snubbers typically increase the manufacturing cost of the device and consume space and energy.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
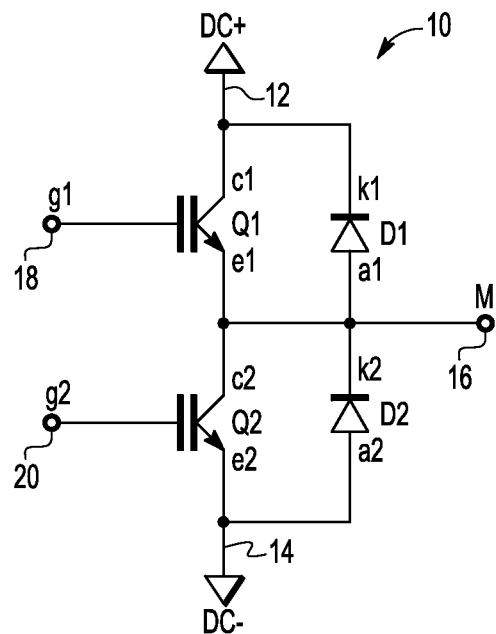
FIG. 1 is a schematic view of an exemplary half-bridge circuit for assembly in accordance with one embodiment.

Power semiconductor modules and other electronic apparatus have die assembled in opposite orientations. The die of one power semiconductor device may be inverted relative to the die of another power semiconductor device. The disclosed modules may include any number of die in both inverted and non-inverted orientations. For example, an electronic apparatus may include die for a power transistor device and a power diode mounted in a flipped (e.g., flip-chip) or other inverted orientation and die for another power transistor device and another power diode mounted in a non-flipped (e.g., non-flip-chip) or non-inverted orientation.

The combination of inverted and non-inverted die may provide interconnect configurations that reduce parasitic impedances (e.g., inductances) in the disclosed modules and apparatus. The interconnect configurations may accordingly reduce or eliminate voltage spikes or over-voltages resulting therefrom. With minimal impedances introduced by the interconnects, the disclosed modules and apparatus may avoid relying on snubbers to prevent damage from over-voltages.

The improved interconnects may additionally or alternatively allow double-sided cooling. For instance, heat sinks and/or other cooling structures or techniques may be provided along both sides of the disclosed modules and other apparatus. The combination of inverted and non-inverted die may also allow one or more decoupling capacitors to be attached in an on-die mounting arrangement or be otherwise placed on the die. The on-die mounting of the decoupling capacitors may accordingly avoid introducing additional sources of parasitic inductance. For these and other reasons, improvements in overall device performance and power density may be achieved.

Although described below in connection with power semiconductor modules with vertical devices, the disclosed modules, apparatus and assembly methods are well-suited for use in other contexts. For example, laterally oriented transistors, diodes, and other devices may include backside contacts and other configurations to support an inverted orientation. Although half-bridge circuits including IGBT devices are described below, the disclosed modules, apparatus, and assembly methods are not limited to a particular transistor configuration or transistor device type. For instance, the disclosed devices and methods may be applied to variety of other power semiconductor devices, such as power FET devices. The disclosed devices and methods are not limited to silicon-based semiconductor devices, any may include devices having other semiconductor materials, e.g., wide band gap materials such as SiC and GaN. One or more features of the disclosed devices may be applied to other circuit configurations, including, for instance, other H bridge circuits, multiple phase inverters, and other types of power inverters and converters.

To the extent that any of the drawing figures or accompanying description indicate or imply a specific majority charge carrier (e.g., an n-type channel) for a device, such drawing figures or description are provided without any intended limitation to the specific carrier type. The disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

FIG. 1 is a schematic view of an exemplary circuit 10 that may be implemented with semiconductor device die having opposite orientations in accordance with one embodiment. The circuit 10 may be encapsulated or otherwise integrated as a power semiconductor module. The circuit 10 includes multiple power semiconductor devices arranged in a half-bridge or half H-bridge configuration. In this example, the circuit 10 includes high side and low side insulated-gate power bipolar transistor (IGBT) devices Q1 and Q2. The high side IGBT device Q1 is disposed between a positive or other high side power rail or other source 12 (e.g., DC+) and an output node or terminal 16. The output node 16 may be coupled to a load, such as a motor M or other inductive load. The low side IGBT device Q2 is disposed between the negative or other low side power rail or other source 14 (e.g., DC−) and the output node 16. The high side and low side power rails 12, 14 may apply a DC bus voltage to the circuit 10 for DC-AC or DC-DC conversion or other switching functionality. The power rail terminals 12, 14 and the output node 16 may be configured as terminals of a power semiconductor module.

The circuit 10 further includes power diodes D1 and D2 connected across the IGBTs Q1, Q2 in respective anti-parallel configurations. The power diodes D1 and D2 couple the output terminal 16 to the high side and low side power rails 12, 14, respectively, to provide paths for currents induced after switching of the inductive load M.

The high side IGBT device Q1 and the power diode D1 together form a high side switch of the circuit 10. The low side IGBT device Q2 and the power diode D2 together form a low side switch of the circuit 10. The high and low side switches may thus provide a dual power semiconductor module in some embodiments. In alternative embodiments, the high and/or low side switches may include devices other than IGBT devices. For example, power FET devices may be used instead of IGBT devices. Any other type of power semiconductor device may be used in the high and low side switches, including, for instance, further power diodes.

The circuit 10 includes a pair of control terminals 18, 20 to provide or receive control signals for the high and low side switches. In this example, the control terminals 18, 20 are coupled to respective gate electrodes or terminals g1, g2 of the IGBT devices Q1, Q2. The control signals may be configured to direct the IGBT devices Q1, Q2 to generate a phased or other AC output at the output terminal 16 to drive the load M. The control terminals 18, 20 may be configured as further terminals of a power semiconductor module or other encapsulation of the circuit 10.

In the half-bridge configuration depicted in FIG. 1, a collector electrode c1 of the IGBT Q1 and a cathode k1 of the power diode D1 are coupled to the terminal 12 providing the DC+ voltage. An emitter electrode e2 of the IGBT Q2 and an anode a2 of the power diode D2 are coupled to the terminal 14 providing the DC− voltage. An emitter electrode e1 of the IGBT Q1 and a cathode k2 of the power diode D2 are coupled to the output node 16 to drive the load M.

Additional, fewer, or alternative power semiconductor devices may be included in the circuit 10. For example, the circuit 10 may include additional IGBT devices and power diodes arranged in another half-bridge configuration in parallel with the devices of the circuit 10. The IGBT devices Q1 and Q2 may be replaced with power FET devices, power diodes, or some other vertical semiconductor devices. The IGBT devices, power diodes, and/or other devices of the circuit 10 may be fabricated via any now known or future developed fabrication process or technology, and may include any one or more semiconductor materials and/or non-semiconductor materials. The disclosed modules and apparatus are thus not limited to any particular device fabrication technique.

Figure 2:
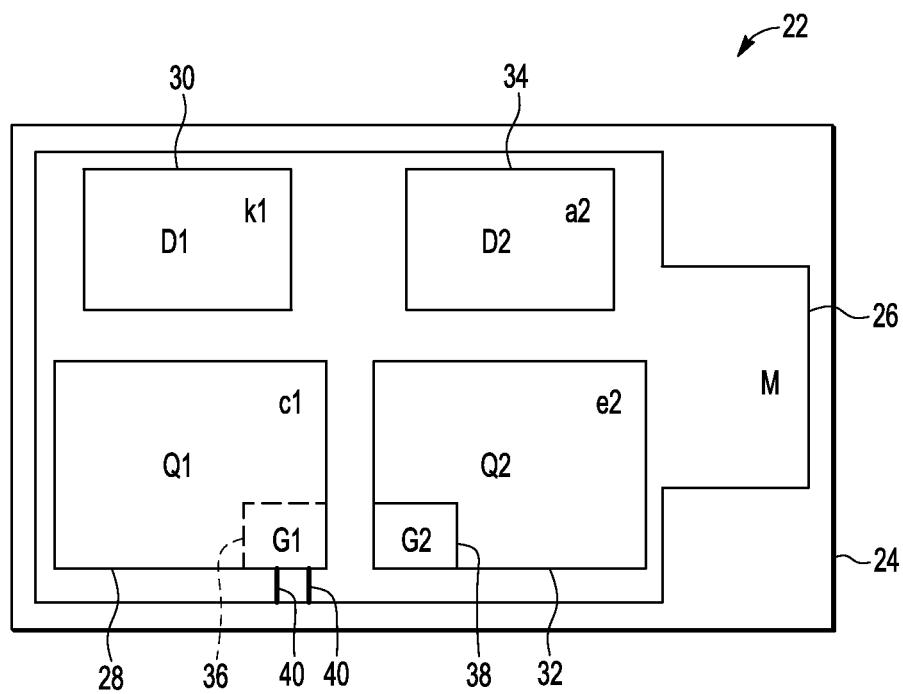
FIG. 2 is a partial plan view of an exemplary electronic apparatus assembled in accordance with one embodiment.

FIG. 2 schematically depicts a top view of an assembly of the circuit 10 (FIG. 1) in an electronic apparatus 22 assembled in accordance with one embodiment. The electronic apparatus 22 may be configured as a power semiconductor module having a base substrate 24 to which die for the semiconductor devices are attached. The base substrate 24 may include any number of layers or structures of varying materials, including, semiconductor, conductive, and/or dielectric materials. The die may be mounted on the base substrate 24 via solder or other metallic bumps formed on an interconnect 26, which may correspond with the output terminal or node 16 (FIG. 1) for driving the load M. The interconnect 26 may be configured as a plate-shaped conductor covering the portions of the base substrate 24 on which the power devices are disposed.

The interconnect 26 may be considered a part of the base substrate 24, but may not laterally cover the entire base substrate 24. Each of the power devices of the circuit 10 may be coupled to the interconnect 26. The interconnect 26 may include one or more metal or other conductive layers or other structures. The attachment of the die to the base substrate 24 and/or the interconnect 26 may thus be indirect with any number of intervening structures or layers.

In this embodiment, each power device is implemented in a respective die. In this example, the apparatus 22 includes a die 28 for the high side IGBT device Q1, a die 30 for the high side power diode D1, a die 32 for the low side IGBT device Q2, and a die 34 for the low side power diode D2. Additional, fewer, or alternative die may be provided in other examples. For example, multiple devices may be disposed on a single die in some cases.

The devices may be configured as vertical semiconductor devices. For example, each vertical semiconductor device may have one or more electrodes or terminals formed on a first side of the die, and one or more other electrodes or terminals formed on a second side of the die opposite of the first side. For example, the IGBT devices Q1, Q2 may be fabricated such that each IGBT die has a collector electrode on one side (e.g., a top or bottom side) and gate and emitter electrodes on an opposite side. The arrangement of the electrodes may vary. For example, the gate of a device may be disposed on the side on which the collector is disposed. The power diodes D1, D2 may be fabricated such that each diode die has a cathode on one side and an anode on an opposing side.

One or more electrodes on each respective die may be coupled to the interconnect 26. The electrode(s) may be directly or indirectly attached to the interconnect 26, e.g., with any number of intervening elements or structures. Bumps may be used in some embodiments, as described below.

The die 28 and 32 for the IGBT devices Q1 and Q2 are disposed on the base substrate 24 in different or opposite orientations. The die 30 and 34 for the power diodes are disposed on the base substrate 24 in different or opposite orientations. One orientation may involve a certain electrode (s) of one device (or die) facing or opposing the base substrate 24. Such electrode(s) may be disposed on a bottom side of the die. For another device (or die) disposed in the other orientation, the same electrode(s) face away from, do not oppose, the base substrate 24. Such electrode(s) may be disposed on a top side of the die. The different orientations may lead to useful interconnection configurations for the apparatus 22. As described below, the resulting interconnections may minimize or eliminate the parasitic inductance arising from interconnections involving assemblies in which all of the transistor die are mounted in the same orientation and/or all of the diode die are mounted in the same orientation.

The top view of the apparatus 22 shown in FIG. 2 depicts the orientation of the die 28, 30, 32, 24. FIG. 2 shows the electrodes on the sides of the die opposite those sides facing the base substrate 24. In this embodiment, the die 28 and 32 for the IGBT devices Q1 and Q2 are oriented differently from one another, facing either inward toward the base substrate 24 or outward away from the base substrate 24. Thus, for vertical semiconductor devices like the IGBT devices Q1 and Q2, either the collector electrode or the emitter electrode faces or opposes the base substrate 24. The die 30 and 34 for the diode devices D1 and D2 may also be oriented differently from one another. For the diode devices D1 and D2, either the cathode or the anode faces the base substrate 24. In this example, the low side dies 32, 34 for the power devices Q2, D2 are oriented or placed so that the cathode k2 of the power diode D2 and the collector c2 of the IGBT device Q2 face the base substrate 24. The high side dies 28, 30 for the power devices Q1, D1 are oriented or placed so that the anode a1 of the power diode D1 and the emitter e1 of the IGBT device Q1 face the base substrate 24. The orientations may differ in other embodiments. For example, the orientations of the low and high side devices may be swapped, such that, for instance, the power devices Q1, D1 are placed so that the cathode k1 of the power diode D1 and the collector c1 of the power device Q1 face the base substrate 24.

Each IGBT device 28, 32 includes a respective gate electrode G to control current flow between the respective emitter and collector electrodes. In this example, the IGBT device Q1 has a gate electrode 36 on the side of the die 28 facing or opposing the base substrate 24. The IGBT device Q2 has a gate electrode 38 on the side of the die 32 facing away from the base substrate 24. Interconnections to the gate electrodes 36, 38 may vary based on whether the electrode is facing the base substrate 24. The apparatus 22 may include one or more traces 40 or other conductive structures disposed on the base substrate 24 and coupled to the gate electrodes facing the base substrate 24. The interconnect 26 may be patterned to provide space for the trace(s) 40. Alternatively or additionally, the trace(s) 40 may be spaced from or otherwise separated from the interconnect 26 via a variety of isolation structures (e.g., a shallow trench isolation (STI) region).

Control signals may be provided to the gate electrode 38 of the IGBT device Q2 via a variety of conductive structures. For example, a wire bond may be coupled to the gate electrode 38. Wire bonds may be used in connection with the gate electrode 38 because the control signals may not involve sufficiently high current levels to present a parasitic inductance problem. Other wire bond interconnects (and the associated inductance problems) may be avoided via the different orientations of the power semiconductor devices.

In other embodiments, the apparatus 22 may alternatively or additionally include power semiconductor devices having a transistor configuration differing from the above-described IGBT devices Q1, Q2. For instance, power FET devices may be used. The IGBT and other transistor devices may nonetheless include a respective charge carrier input electrode or terminal, a respective charge carrier output electrode or terminal, and a respective control terminal to control current flow between the charge carrier input and output terminals. For example, instead of an emitter electrode, the semiconductor devices may include a source electrode as a charge carrier input terminal. A drain electrode may be provided as a charge carrier output terminal instead of the collector electrode. The characteristics of the control electrode may also vary from the above-described gate electrodes. For example, the control electrode may be configured as a base electrode of a BJT device. The power semiconductor devices may thus be mounted in opposite orientations regardless of whether the devices are configured with emitters, collectors, or other electrodes.

The different orientations of the power semiconductor devices may be extended to other vertical device configurations. For example, one power semiconductor device may be oriented such that the charge carrier input and control terminals are disposed on a die side facing the base substrate 24. Another power semiconductor device may be oriented such that the charge carrier output terminal is disposed on a die side facing the base substrate 24.

The power diodes D1 and D2 may be coupled to the transistor devices Q1 and Q2 in respective anti-parallel configurations despite the different orientations of the transistor dies. In the example shown in FIG. 2, the dies 30 and 34 of the power diodes D1 and D2 are oriented such that the anode a1 and the cathode k2 are attached or coupled to the interconnect 26. The low and high side switches of a half-bridge configuration may accordingly be formed.

Figure 3:
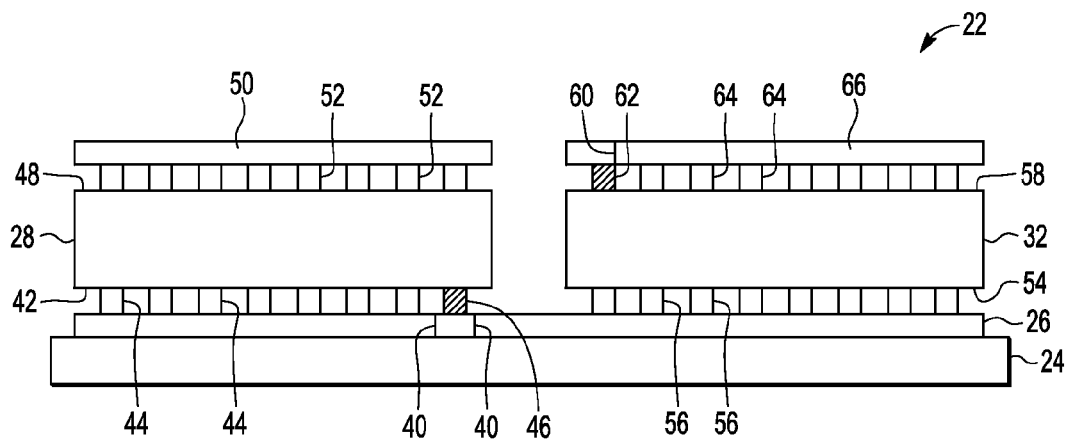
FIG. 3 is a side view of the exemplary electronic apparatus of FIG. 2 to depict inverted and non-inverted mounting orientations of power semiconductor device die on a base substrate.
Figure 4:
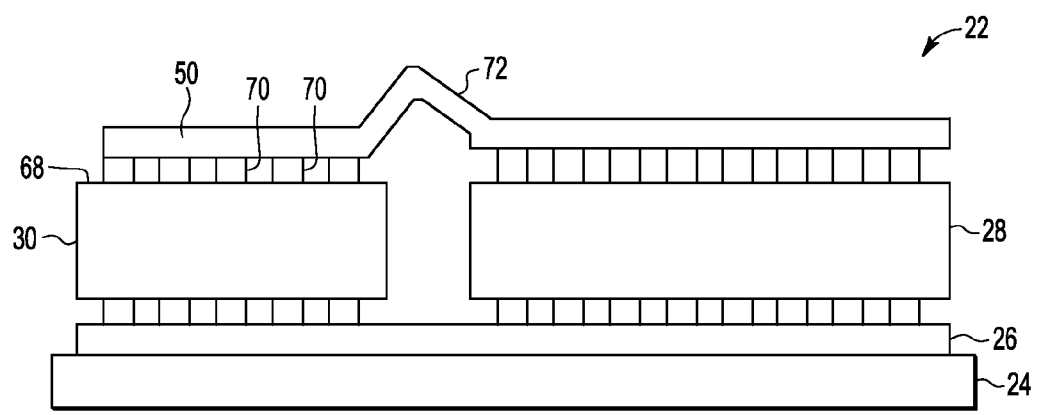
FIG. 4 is another side view of the exemplary electronic apparatus of FIG. 2 to depict a power diode die mounted on the base substrate in an orientation that accommodates the inverted orientation of the power semiconductor device die shown in FIG. 3.

FIGS. 3 and 4 are side views of the apparatus 22 to depict the different orientations of the die in greater detail.

The side view of FIG. 3 depicts the die 28 and 32 of the IGBT devices Q1 and Q2, respectively. The die 28 is oriented such that the gate and emitter electrodes of the IGBT device Q1 are disposed on a side 42 facing the base substrate 24 and coupled to the interconnect 26 via one or more bumps 44. A gate bump 46 may be dedicated to establishing a connection between the gate electrode of the IGBT device Q1 and the traces 40. In this example, the traces 40 include segments that pass through the interconnect 26 as shown. The configuration of the traces 40 may vary from the schematic depiction of FIG. 3. The collector c1 of the IGBT device Q1 is disposed on a side 48 of the die 28 opposite the side 42. An interconnect 50 of the apparatus 22 may be coupled to the collector c1 via one or more bumps 52.

Turning to the opposite orientation for the die 32 (FIG. 3), the collector electrode c2 of the IGBT device Q2 is disposed on a side 54 facing the base substrate 24 and coupled to the interconnect 26 via one or more bumps 56. The gate and emitter electrodes of the IGBT device Q2 are disposed on a side 58 opposite of the side 56. In this example, a wire bond is schematically depicted at 60 and coupled to the gate electrode of the IGBT device Q2 via a bump 62. One or more bumps 64 couple the emitter electrode of the IGBT device Q2 to an interconnect 66.

The interconnects 50 and 66 may establish the remaining connections in the half-bridge circuit (FIG. 1). In this example, the interconnects 50 and 66 provide the high side and low side DC power rails DC+ and DC− (FIG. 1), respectively, as well as the connections between the power devices for the anti-parallel configuration of the half-bridge circuit. The interconnect 50 couples the high side power rail DC+ to the IGBT device Q1 and the power diode D1. The collector c1 of the IGBT device Q1 is thus coupled to the cathode k1 of the power diode D1. As shown in FIG. 4, the die 30 of the power diode D1 is oriented such that the cathode k1 is disposed on a side 68 facing away from the base substrate 24. One or more bumps 70 may couple the cathode k1 to the interconnect 50. Although not shown in FIG. 4, the interconnect 66 couples the power rail DC− to the IGBT device Q2 and the power diode D2. The bump(s) 64 (FIG. 3) may provide the connection to the IGBT device Q2, while one or more further bumps may provide the connection to the power diode D2. The emitter electrode e2 of the IGBT device Q2 is thus coupled to the anode a2 of the power diode D2.

The interconnects 50 and 66 may be configured as metal plates. As shown in FIG. 3, each plate is attached and electrically coupled to a respective one of the IGBT devices Q1 and Q2. Each plate is disposed along the sides 48, 58 of the die 28, 32 not attached to the base substrate 24. The plates may reduce the parasitic inductance despite being coupled to the devices and acting as DC bus interconnects. The construction of the metal plates may vary. In one example, each plate is configured as a copper strip. The strip may have multiple layers in other embodiments. Alternative or additional metals may be used. As shown in FIG. 4, the metal plates or strips need not be uniformly flat, and may include one or more folded or creased sections 72 configured to provide thermal expansion compensation.

The configuration and construction of the above-referenced bumps may vary. The bumps may be configured as solder bumps and/or bumps of one or more metallic or other conductive materials. The bumps may be formed or placed on the die or interconnects in many ways, including evaporation, electroplating, printing, jetting, stud bumping, and direct placement. In other embodiments, one or more of the die attachments is achieved using conductive glue or other non-bump structures.

Figure 5:
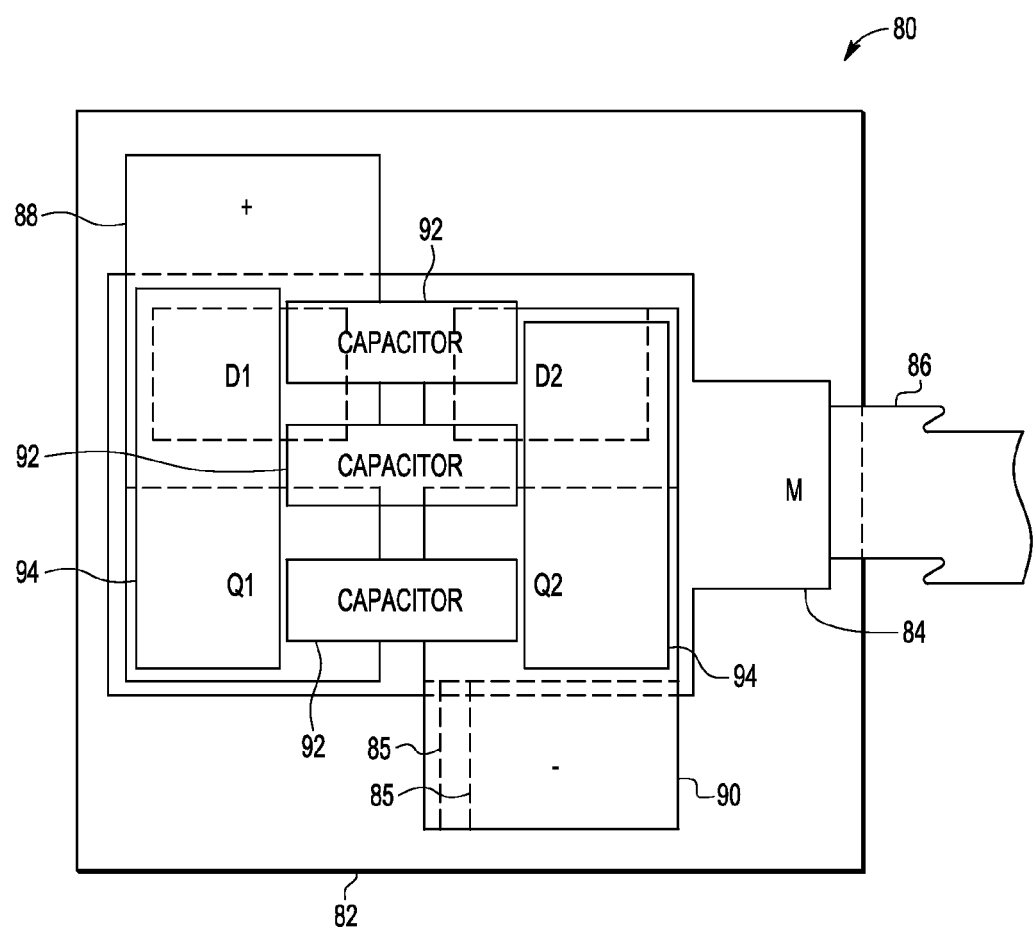
FIG. 5 is a top, schematic view of an exemplary power semiconductor module configured in accordance with one embodiment.

FIG. 5 depicts a power semiconductor module 80 or other electronic apparatus assembled in accordance with one embodiment. The module 80 is configured as a half-bridge circuit having respective die for vertical semiconductor devices Q1, Q2 and power diodes D1, D2 in anti-parallel arrangements. The vertical semiconductor devices Q1, Q2 may be IGBT devices or other power semiconductor devices as described above. The die of the devices Q1 and Q2 have opposite orientations relative to a base substrate 82. The die of the power diodes D1 and D2 also have opposite orientations as described above. Such opposite orientations may enable interconnects as described above, in which each of the devices Q1, Q2, D1, D2 is coupled to an output interconnect 84 disposed between the device die and the base substrate 82. As described above, each device may be coupled to the output interconnect 84 via one or more bumps disposed along a die side opposing the base substrate 82. One or more wire bonds 85 may be coupled to a gate electrode of the vertical semiconductor device Q2.

The output interconnect 84 may be coupled to an inductive load M via conductive ribbon 86. The conductive ribbon 86 may be flexible to allow for thermal expansion. The conductive ribbon 86 may be coupled to an output terminal of the module 80 driven by the first and second vertical semiconductor devices.

The devices Q1 and D1 are coupled to a DC bus interconnect 88 providing a high side power rail, while the devices Q2 and D2 are coupled to a DC bus interconnect 90 providing a low side power rail. Each DC bus interconnect 88, 90 extends across sides of the corresponding die facing away from the base substrate 82, e.g., the die sides opposite the sides facing the output interconnect 84. Each DC bus interconnect 88, 90 may be configured as a metal plate or strip as described above. The DC bus interconnects 88, 90 may be coupled to one or more dedicated conductors in the conductive ribbon 86. Alternatively or additionally, the output interconnect 82 and/or one or both of the DC bus interconnects 88, 90 are coupled to lead frames or other terminals of the module 80.

The power semiconductor module 80 includes one or more decoupling capacitors 92 connected across the DC bus interconnects 88, 90. The decoupling capacitors 92 are mounted or attached to the die of the module 80 in an on-die configuration. In this example, the decoupling capacitors 92 may be placed directly over the plates or stripes forming the DC bus interconnects 88, 90. The parasitic inductance presented by the decoupling capacitors 92 may thus be minimized. The decoupling capacitors 92 may be indirectly mounted on the die, i.e., via the DC bus interconnects 88, 90. The decoupling capacitors 92 may alternatively be disposed between the die and the DC bus interconnects 88, 90.

Each decoupling capacitor 92 may include a surface-mount capacitor soldered directly to the metal plate or strip of the DC bus interconnect 88, 90. In other embodiments, the decoupling capacitors 92 may have other configurations or constructions.

The power semiconductor module 80 may also include one or more heat sinks 94 disposed along and/or coupled to one or more of the structures exposed along an exposed surface of the module 80 shown in FIG. 5 (e.g., the surface opposite the side facing the base substrate 82). In this example, each one of the heat sinks 94 is disposed along a respective one of the DC bus interconnects 88, 90. The heat sinks 94 may thus be in thermal communication with the sides of the die not opposing or facing the base substrate 82. The heat sinks 94 may be indirectly attached to the structures, such as the DC bus interconnects 88, 90. For example, the heat sinks 94 may be coupled to a housing, enclosure, or other encapsulation of the power semiconductor module 80. The configuration of the heat sinks 94 may vary in other ways. The heat sinks 94 are accordingly depicted schematically in FIG. 5.

The power semiconductor module 80 may include one or more additional heat sinks along or coupled to the base substrate 82. Such additional heat sinks may be in thermal communication with the sides of the die facing or opposing the base substrate 82. The module 80 may thus have a dual-sided cooling arrangement.

The power semiconductor module 80 may include a block or other housing in which the devices are encapsulated or otherwise packaged. The configuration and other characteristics of the packaging may vary. In one example, the housing includes a block that provides mechanical support (e.g., for the bus interconnects 88, 90). The block may also facilitate the electrical attachment of terminals to the bus interconnects 88, 90. The terminal attachment may be achieved via a variety of attachment techniques. A terminal may also be attached to the output interconnect 84 in some embodiments.

The assembly of half-bridge and other circuits with opposite die orientations need not involve encapsulation or integration in a single power semiconductor module. The circuits may be assembled as an electric apparatus with an alternative configuration or encapsulation. For example, the transistors or other power semiconductor devices may be assembled or packaged in one housing (with opposite die orientations), while the power diodes or other anti-parallel devices may be assembled or packaged in a separate housing. The devices may be encapsulated or housed in a variety of enclosures.

Described above are die attachment arrangements for power semiconductor modules and other electronic apparatus that may achieve low interconnect impedance. The arrangements may include one switch die and one diode die attached to a substrate in regular orientations (via, e.g., soldering, conductive glue or metallic bumps) and one switch die and one diode die flipped from the regular orientation such that, e.g., a gate side is facing the substrate. Attachment to interconnects extending along the upper or exposed die sides may be made via bumps or other techniques or structures. Connection to the gate electrode facing the substrate may be made through a trace on the substrate. The arrangements may minimize interconnect impedances, thereby eliminating the need for snubbers or other circuitry. As described above, the arrangements may also enable the use of on-chip decoupling capacitors that introduce minimal, if any, parasitic inductance. As also described above, the arrangements may also provide the opportunity to achieve cooling of both sides of the semiconductor devices.

Figure 6:
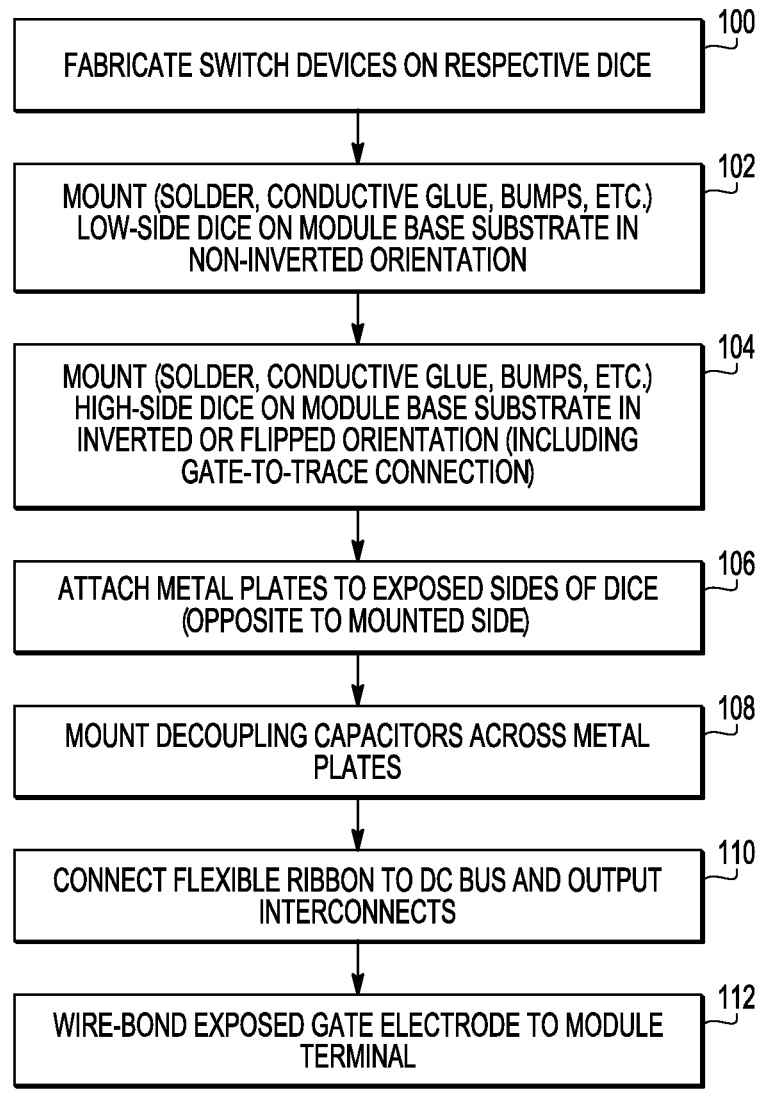
FIG. 6 is a flow diagram of an exemplary method of assembling an electronic apparatus having inverted and non-inverted die in accordance with one embodiment.

FIG. 6 shows an exemplary method for assembling a power semiconductor module or other electronic apparatus with such interconnect arrangements. The method includes a sequence of acts, only the salient of which are depicted for convenience in illustration. For example, the method may include a number of acts directed to preparing a base substrate for the assembly method. The ordering of the acts may vary in other embodiments.

The assembly method may begin with an act 100 in which multiple switch devices (e.g., IGBT or other power devices) are fabricated on respective die. The act 100 may include the fabrication of any number of switch devices, diodes, or other power devices, involving any number of die. One or more of the device types may be configured as a vertical semiconductor devices to enable the disposition of die in different orientations as described above. The method is not limited to any particular type of power semiconductor module or circuit mechanism, and may include future developed circuits. The device fabrication methods may vary considerably, and may involve future developed fabrication techniques.

In act 102, at least one die is mounted or otherwise attached to a base substrate in a first orientation. In this example, the first orientation is a non-inverted orientation, such as a gate-up orientation. The base substrate may include an interconnect or other metallic or conductive layer to which the die is attached. The interconnect may correspond with an output terminal of the module, as described above. One or more electrodes of the device(s) fabricated on the die are coupled to the interconnect. The mounting or other attachment may include or involve soldering, conductive glue, or any type of bump-based attachment.

In act 104, at least one die is mounted or otherwise attached to the base substrate in a second orientation inverted relative to the first orientation. In this example, the second orientation is an inverted or flip-chip orientation relative to the base substrate, such as a gate-down orientation in which a gate electrode of the device faces or opposes the base substrate. One or more electrodes of the device(s) fabricated on the die are coupled to the interconnect. Due to the inversion of the vertical device(s), the electrodes differ from those of the devices coupled to the interconnect in act 102.

The method may include attachment in act 106 of one or more plates or other interconnects to the devices mounted on the base substrate. The plates may be attached to the sides of the die that remain exposed or not attached to the base substrate. In some cases, the plates serve as DC bus interconnects. The plates may be configured as strips of one or more metallic or other conductive materials (e.g., copper).

In the embodiment shown in FIG. 6, one or more decoupling capacitors are mounted in act 108 across the DC bus or other interconnects. The decoupling capacitors may be mounted directly to the metal plates. The decoupling capacitors may thus include surface-mount capacitors. Other mounting techniques, arrangements, or structures may be used.

In act 110, one or more of the interconnects are connected to a flexible ribbon, cable, or other conductive structure used to couple the power semiconductor module to a power source, a load, or other circuit. The flexible ribbon may allow for thermal dilatation. The flexible ribbon may carry any number of the signals and/or DC power rails to and from the module. In one example, the flexible ribbon may carry the DC power rails and the output of the module, but not gate or other control signals. One or more traces may be formed on the base substrate to accommodate such control signals. In this example, a wire bond is established in act 112 for the exposed gate electrode, e.g., the gate electrode for the device fabricated on the non-inverted die.

Additional acts may be implemented at various points during the assembly procedure. For example, one or more acts may be directed to encapsulation, heat sink attachment, and other fabrication or assembly procedures.

The assembly methods may provide a power semiconductor module or other electronic apparatus with low interconnect impedances. The assembly method may eliminate or minimize inductive noise generating connections, such as wire bonding, to only low current connections (e.g., a gate control signal).

In a first aspect, an electronic apparatus includes a base substrate, the base substrate including an interconnect. The electronic apparatus further includes a first die including a first semiconductor device, the first semiconductor device being coupled to the interconnect, and a second die including a second semiconductor device, the second semiconductor device being coupled to the interconnect. The first and second die are attached to the base substrate in opposite orientations.

In a second aspect, a power semiconductor module includes a base substrate, which, in turn, includes an interconnect, first and second vertical semiconductor devices coupled to the interconnect, and first and second power diodes coupled to the interconnect and further coupled to the first and second vertical semiconductor devices, respectively, in a half-bridge configuration. Each of the first and second power semiconductor devices and the first and second power diodes are implemented in respective die. The respective die of the first vertical semiconductor device is attached to the base substrate in a first orientation, and the respective die of the second vertical semiconductor device is attached to the base substrate in a second orientation inverted relative to the first orientation.

In a third aspect, a method of assembling an electronic apparatus includes fabricating first and second vertical semiconductor devices with first and second die, respectively, mounting the first die on a base substrate in a first orientation, and mounting the second die on the base substrate in a second orientation inverted relative to the first orientation. Mounting the first die and the mounting the second die couples the first and second vertical semiconductors to an interconnect disposed on the base substrate.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. An electronic apparatus comprising:
   a base substrate comprising an interconnect;
   a first die comprising a first semiconductor device, the first semiconductor device being coupled to the interconnect;
   a second die comprising a second semiconductor device, the second semiconductor device being coupled to the interconnect; and
   a decoupling capacitor attached to the first and second die in an on-die mounting arrangement;
   wherein the first and second die are attached to the base substrate in opposite orientations in which one of the first and second die is inverted relative to the other of the first and second die.

2. The electronic apparatus of claim 1, wherein the base substrate comprises a trace to which a control terminal of the second semiconductor device is coupled.

3. The electronic apparatus of claim 1, further comprising first and second metal plates attached and electrically coupled to the first and second semiconductor devices, respectively, and disposed along sides of the first and second die opposite to sides of the first and second die attached to the base substrate, respectively.

4. The electronic apparatus of claim 3, wherein the first and second metal plates are coupled to the first and second semiconductor devices as DC bus interconnects.

5. The electronic apparatus of claim 3, wherein the decoupling capacitor is connected across the first and second metal plates.

6. The electronic apparatus of claim 5, wherein the decoupling capacitor comprises a surface-mount capacitor attached directly to the first and second metal plates.

7. The electronic apparatus of claim 1, wherein the first and second semiconductor devices are similar devices.

8. The electronic apparatus of claim 1, further comprising a heat sink disposed along sides of the first and second die opposite to sides of the first and second die attached to the base substrate.

9. The electronic apparatus of claim 3, further comprising first and second power diodes coupled to the first and second semiconductor devices in an anti-parallel configuration to form first and second switches in a half-bridge configuration, respectively, wherein:
   the first and second power diodes are electrically coupled to the first and second semiconductor devices via the first and second metal plates, respectively;
   each of the first and second power diodes comprises a respective die;
   the die of the first power diode is oriented such that an anode of the first power diode is attached to the interconnect; and
   the die of the second power diode is oriented such that a cathode of the second power diode is attached to the interconnect.

10. The electronic apparatus of claim 9, wherein the first and second semiconductor devices and the first and second power diodes are configured as vertical semiconductor devices.

11. The electronic apparatus of claim 1, wherein:
    each of the first and second semiconductor devices comprises a respective charge carrier input terminal, a respective charge carrier output terminal, and a respective control terminal to control current flow between the charge carrier input and output terminals;
    the charge carrier input and control terminals of the first semiconductor device are disposed on a first side of the first die facing the base substrate;
    the charge carrier output terminal of the first semiconductor device is disposed on a second side of the first die opposite to the first side of the first die;
    the charge carrier output terminal of the second semiconductor device is disposed on a first side of the second die facing the base substrate; and
    the charge carrier input and control terminals of the second semiconductor device are disposed on a second side of the second die opposite to the first side of the second die.

12. The electronic apparatus of claim 1, wherein the interconnect comprises a plate-shaped conductor on which the first and second die are disposed.

13. A power semiconductor module comprising:
    a base substrate comprising an interconnect;
    first and second semiconductor devices coupled to the interconnect;
    first and second power diodes coupled to the interconnect and further coupled to the first and second semiconductor devices, respectively, in a half-bridge configuration;
    a first metal plate electrically coupling the first semiconductor device and the first power diode; and
    a second metal plate electrically coupling the second semiconductor device and the second power diode;
    wherein each of the first and second semiconductor devices and the first and second power diodes are implemented in respective die,
    wherein the die of the first semiconductor device is attached to the base substrate in a first orientation,
    wherein the die of the second semiconductor device is attached to the base substrate in a second orientation inverted relative to the first orientation, and
    the first and second metal plates are disposed along sides of the respective die coupled thereby opposite to sides of the respective die attached to the base substrate.

14. The power semiconductor module of claim 13, wherein:
    the die of the first power diode is oriented such that an anode of the first power diode is attached to the base substrate; and
    the die of the second power diode is oriented such that a cathode of the power diode is attached to the base substrate.

15. The power semiconductor module of claim 13, wherein the first and second metal plates are configured as DC bus interconnects.

16. The power semiconductor module of claim 15, further comprising a decoupling capacitor connected across the first and second metal plates.

17. The power semiconductor module of claim 13, further comprising a heat sink disposed along the sides of the respective die opposite to the sides attached to the base substrate.

18. The power semiconductor module of claim 13, wherein the interconnect is an output terminal of the half-bridge configuration.

19. The power semiconductor module of claim 13, wherein the interconnect comprises a plate-shaped conductor on which the respective die of the first and second semiconductor devices and the first and second power diodes are disposed.

20. The power semiconductor module of claim 13, further comprising first and second heat sinks disposed along the first and second metal plates, respectively.

* * * * *